United States Patent [19]
Rahman et al.

[11] Patent Number: 6,026,355
[45] Date of Patent: Feb. 15, 2000

[54] SOLID STATE WATT-HOUR METER USING GMR SENSOR

[75] Inventors: Mizanur Rahman, Minneapolis; Roberto Capriotti, Farmington; Jerry J. Conley; Gary B. Mortensen, both of Waseca, all of Minn.

[73] Assignee: Itron, Inc., Spokane, Wash.

[21] Appl. No.: 09/103,230

[22] Filed: Jun. 23, 1998

Related U.S. Application Data

[60] Provisional application No. 60/051,464, Jul. 1, 1997, provisional application No. 60/026,277, Sep. 18, 1996, and provisional application No. 60/055,334, Aug. 12, 1997.

[51] Int. Cl.$^7$ .................................................. G01R 21/00
[52] U.S. Cl. ........................... 702/189; 702/60; 702/61; 702/64; 324/178; 324/144
[58] Field of Search ............................ 702/189, 60, 61, 702/64; 364/528.3, 528.21; 324/103 R, 116, 142, 178–179, 144

[56] References Cited

U.S. PATENT DOCUMENTS

| | | | |
|---|---|---|---|
| 3,921,069 | 11/1975 | Milkovic | 324/142 |
| 4,027,241 | 5/1977 | Jauch . | |
| 4,283,643 | 8/1981 | Levin | 324/117 H |
| 4,467,434 | 8/1984 | Hurley et al. | 364/528.3 |
| 4,682,102 | 7/1987 | Milkovic . | |
| 4,692,874 | 9/1987 | Mihara | 702/61 |
| 4,754,219 | 6/1988 | Milkovic . | |
| 4,786,863 | 11/1988 | Milkovic . | |
| 5,059,896 | 10/1991 | Germer et al. . | |
| 5,325,051 | 6/1994 | Germer et al. . | |
| 5,701,222 | 12/1997 | Gill et al. | 360/113 |
| 5,825,595 | 10/1998 | Gill | 360/113 |

*Primary Examiner*—Marc S. Hoff
*Assistant Examiner*—Bryan Bui
*Attorney, Agent, or Firm*—Patterson & Keough, P.A.

[57] ABSTRACT

A power consumption meter is disclosed for measuring the power consumed by a load on a power conductor, wherein the electronics of the power consumption meter are isolated from lightning and power transients. The meter has a first GMR sensor that is disposed proximate the power conductor and is magnetically coupled to the power conductor. The first GMR sensor detects magnetic flux in the power conductor and produces a first output responsive to the detected magnetic flux that is representative of the current flowing through the power conductor. A second GMR sensor is disposed proximate the power conductor and is magnetically coupled to the power conductor. The second GMR sensor detects magnetic flux in the power conductor and produces a second output responsive to the detected magnetic flux that is representative of the voltage on the power conductor. A processor is operably communicatively coupled to the first and second GMR sensors and is responsive to the first output and the second output for producing a third output that is representative of the energy consumption of the load on the power conductor. In an embodiment, a third GMR sensor provides feedback for auto-scaling of the first GMR sensor.

47 Claims, 8 Drawing Sheets

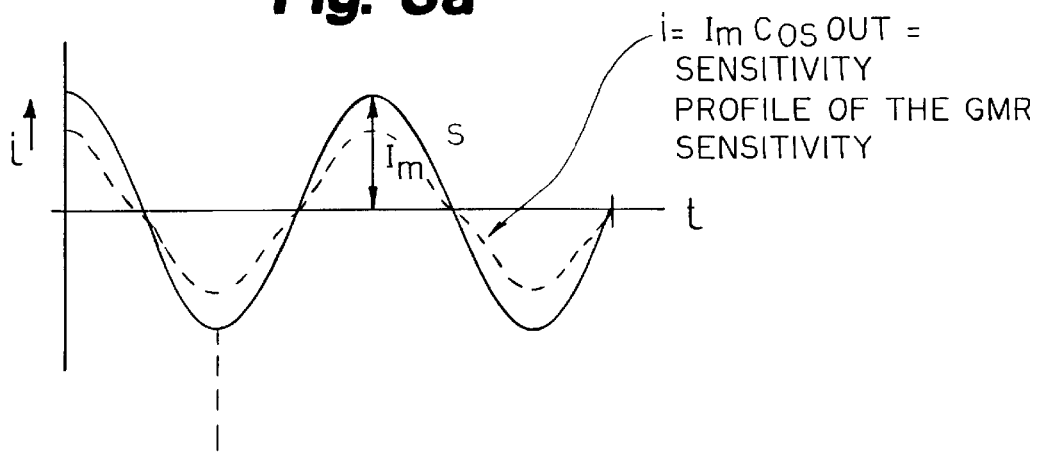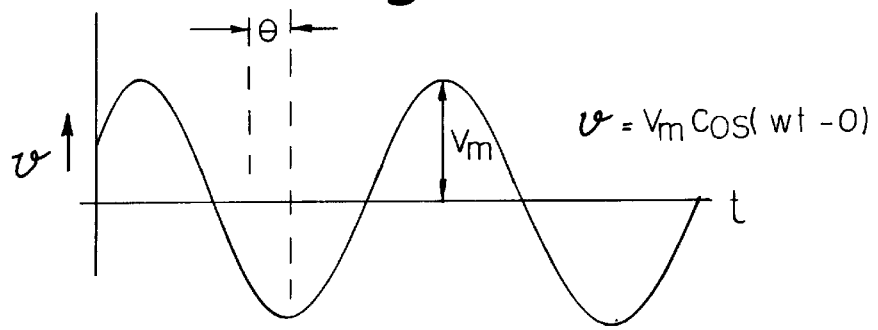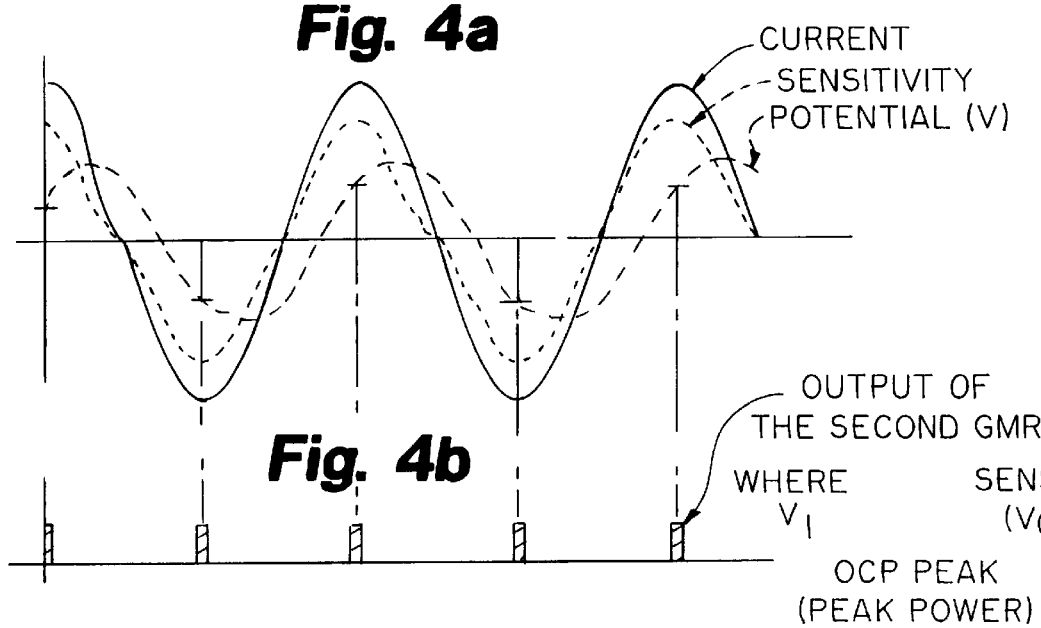

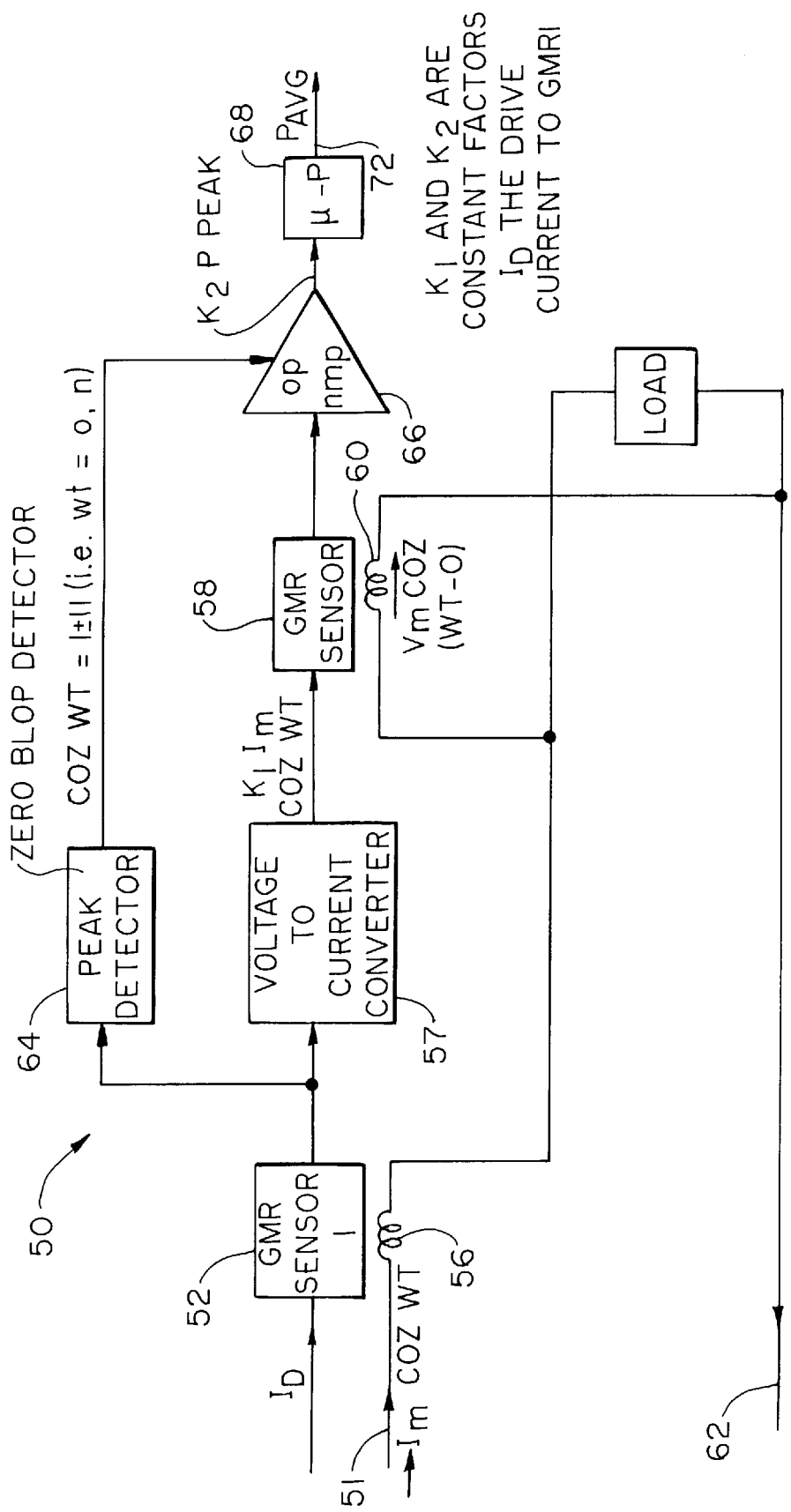

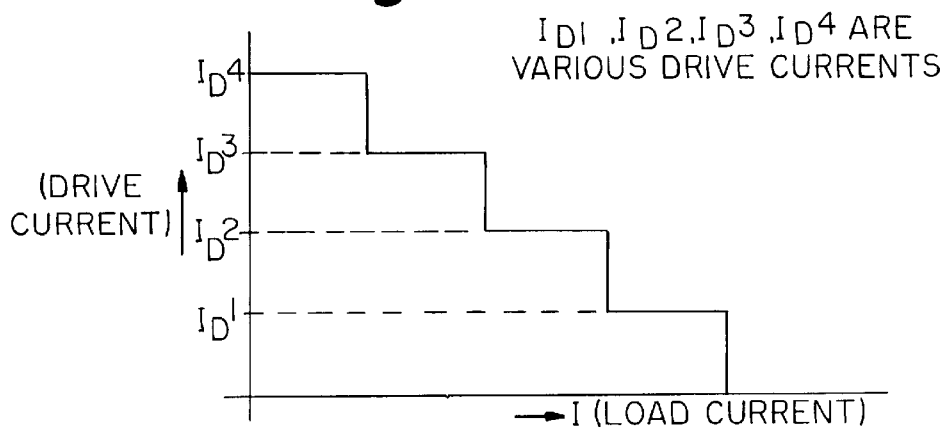
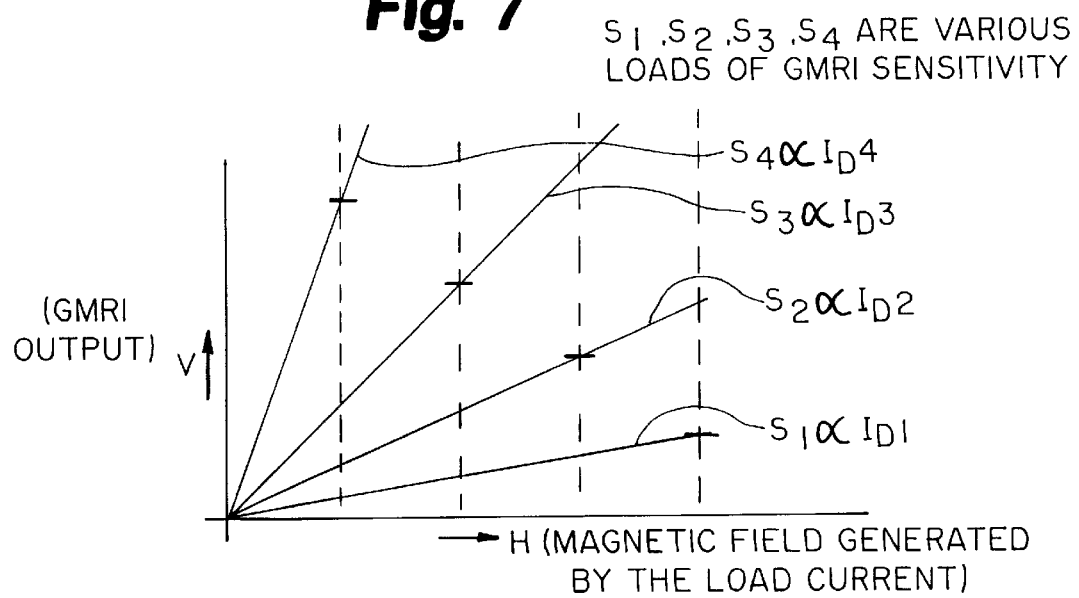

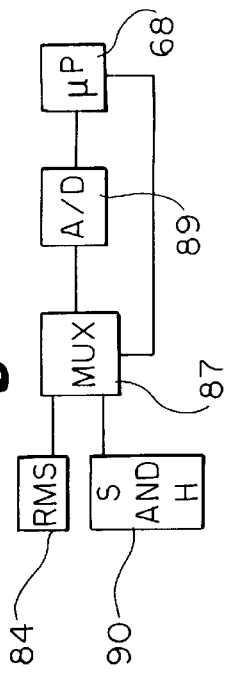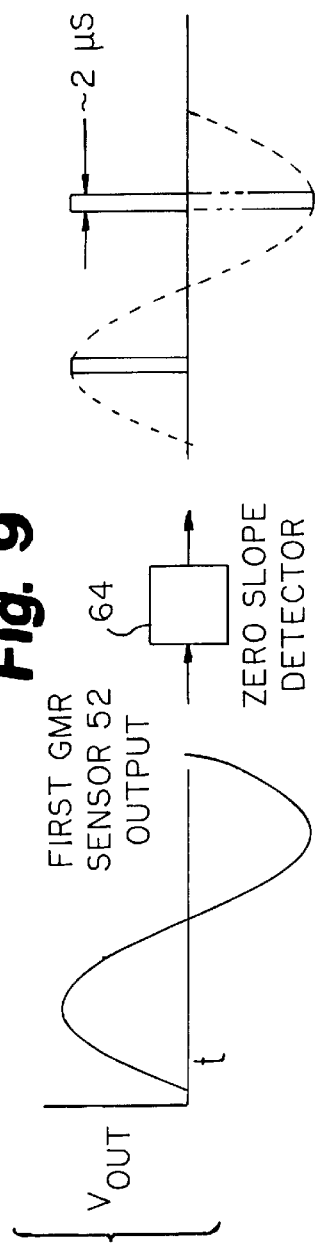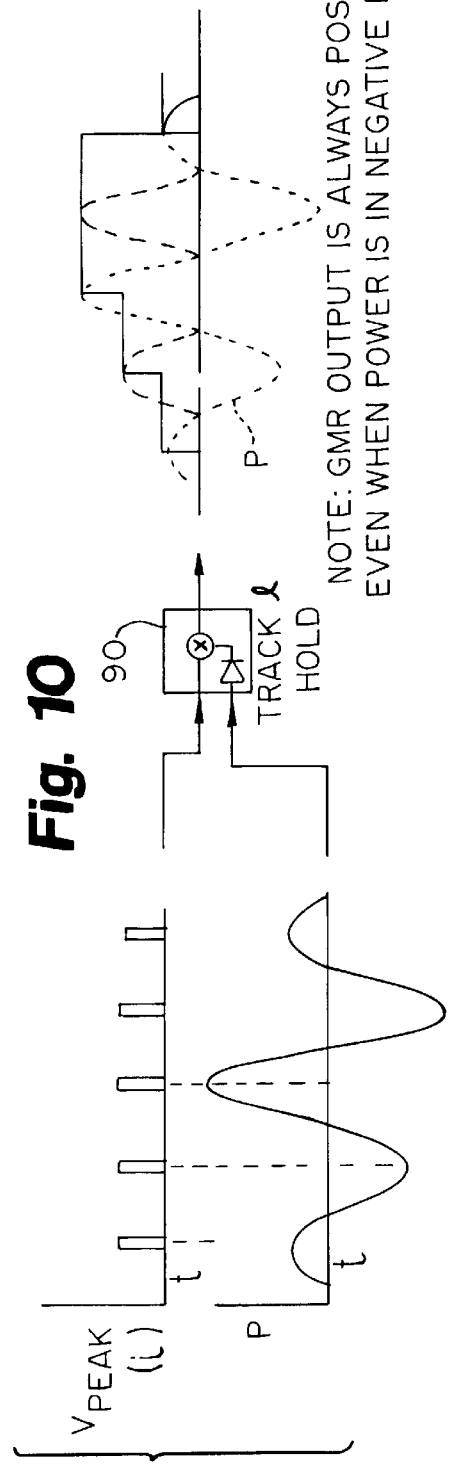

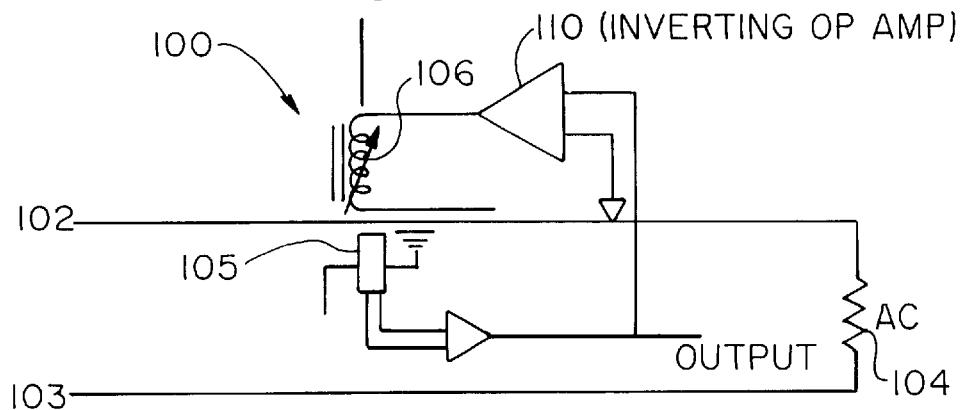
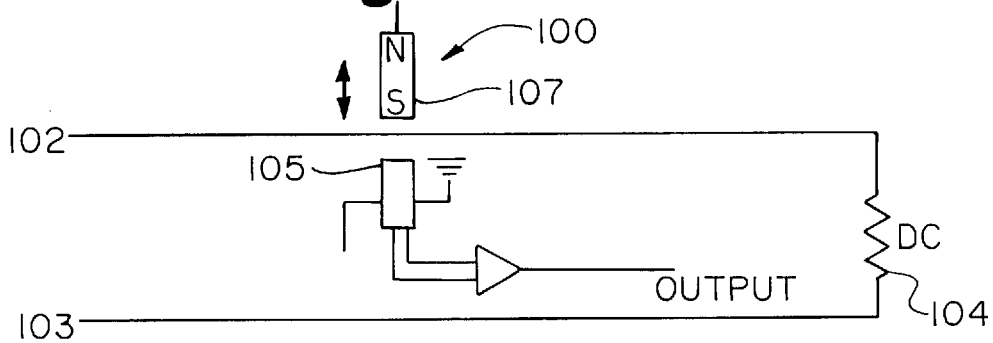
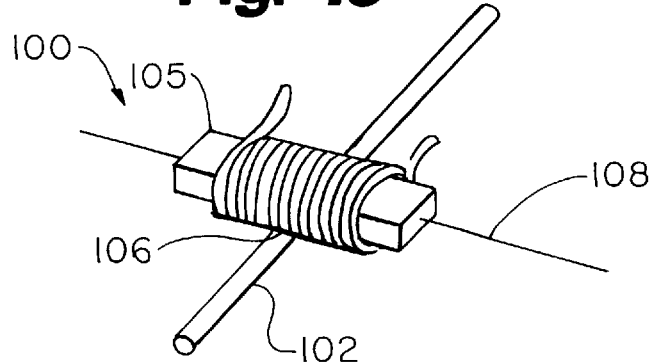

SOLID STATE WATT-HOUR METER USING GMR SENSOR

RELATED APPLICATIONS

The present application claims the benefit of U.S. Provisional Patent Application Ser. No. 60/051,464, filed Jul. 1, 1997 entitled "MAGNETICALLY ISOLATED KILOWATT HOUR METER", which claims the benefit of U.S. Provisional Patent Application Ser. No. 60/026,277, filed Sep. 18, 1996, entitled "GMR SENSOR FOR COUNT AND TAMPER DETECTION", and further claims the benefit of U.S. Provisional Patent Application Ser. No. 60/055,334, filed Aug. 12, 1997, entitled "ADJUSTABLE GMR FEEDBACK CONTROL SYSTEM FOR A CURRENT SOURCE", all of which are incorporated herein by reference.

FIELD OF THE INVENTION

The present invention relates to power meters as used to measure and record power consumption in kilowatts. More particularly, the present invention relates to the use of Giant Magnetoresistive Ratio (GMR) devices to measure the voltage and current passing through a power line.

BACKGROUND OF THE INVENTION

There has been a trend in the power generation industry to move from analog based meters to solid state meters. Concerns for reliability, low power consumption, and low cost manufacturing make the use of integrated circuits very desirable for as many metering functions as possible. The meter must be as resistant as possible to lightning and power transients on the line in which the current is being measured. Further, the range of power consumption levels that must be measured by a particular meter varies greatly. With existing meters, there is generally accurate measure of power consumption at relatively high levels of power consumption. However, there has historically been substantial inaccuracies in measured power at low levels of power consumption.

While there are known solid state meters, there remains a need in the industry for such meters that exhibit enhanced characteristics, as will be described. One such characteristic is that there is a need in the industry to electronically isolate the electronics that sense power consumption in the meter from the power line. Such isolation gives the meter increased protection from lightning and power transients. A further characteristic is that there is additionally a need to accurately sense watt hour consumption over a wide range of power usage. This is especially critical at low power levels, where meter resolution and accuracy has been lacking.

SUMMARY OF THE INVENTION

The present invention senses voltage and current passing through a power line by means of magnetic fields. The only connection between the electronics sensing the voltage and current in the power line is by means of the magnetic field generated by the current flow in the power line. Accordingly, the electronics are substantially isolated from lightning and power transients that may occur on the power line.

Additionally, by using a set of GMR sensors to construct a solid state watt hour meter, the watt hour meter can be low cost, highly accurate, and compact. The meter utilizes the GMR sensors to detect current flow through a conductor or power line, to capture sinusoidal function of the current (where $i=I_M \cos \omega t$), change sensitivity of at least one of the GMR sensors proportional to the captured sinusoidal function, and implement the sensitivity to detect magnetic fields generated by the potential coil. By altering the sensitivity of at least one of the GMR sensors, very low power consumption can be accurately and reliably detected.

The present invention is a power consumption meter for measuring the power consumed by a load on a power conductor, wherein the electronics of the power consumption meter are isolated from lightning and power transients. The meter has a first GMR sensor that is disposed proximate the power conductor and is magnetically coupled to the power conductor. The first GMR sensor detects magnetic flux in the power conductor and produces a first output responsive to the detected magnetic flux that is representative of the current flowing through the power conductor. A second GMR sensor is disposed proximate the power conductor and is magnetically coupled to the power conductor. The second GMR sensor detects magnetic flux in the power conductor and produces a second output responsive to the detected magnetic flux that is representative of the voltage on the power conductor. A processor is operably communicatively coupled to the first and second GMR sensors and is responsive to the first output and the second output for producing a third output that is representative of the energy consumption of the load on the power conductor.

BRIEF DESCRIPTION OF THE DRAWINGS

FIGS. 3a and 3b are two related graphs having a common abscissa, the graphs depicting of current and voltage with respect to time and the sensitivity of a GMR sensor;

FIG. 4a and 4b are two related graphs having a common abscissa, the graphs depicting current, sensitivity, and potential to the output of the second GMR sensor depicted in FIGS. 2 and 8;

FIG. 5 is a further preferred embodiment circuit diagram of the electrical circuit of the present invention;

FIG. 6 is a graph of the drive current of the first GMR sensor as compared to load current;

FIG. 7 is a graph of the voltage of the output of the first GMR sensor as compared to the magnetic field generated by the load current;

FIG. 8a is an additional preferred portion of embodiment of the circuit diagram of the electrical circuit of the present invention as depicted in FIG. 8;

FIG. 9 is a graphical representation of the function of the zero slope detector;

FIG. 10 is a graphical representation of the function of the track and hold device;

FIG. 11 is a circuit diagram of a circuit sensor for AC applications;

FIG. 12 is a circuit diagram of a circuit sensor for DC applications; and

FIG. 13 is a depiction of the current sensor of FIG. 11.

DETAILED DESCRIPTION OF THE DRAWINGS

Figure 1:
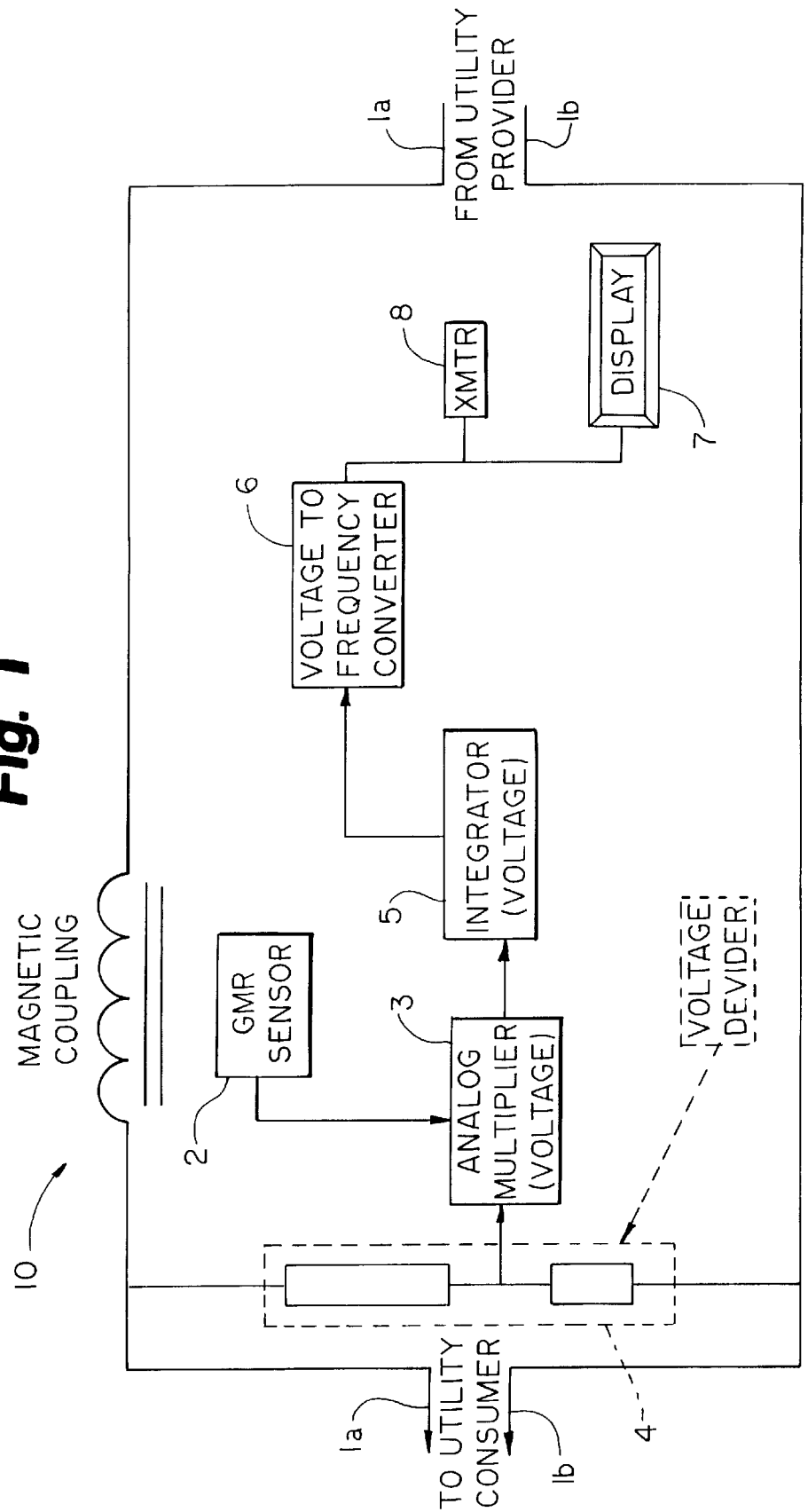
FIG. 1 is a schematic diagram of the electrical circuit of the present invention applicable to sensing DC power consumption.

The meter of the present invention is shown generally at 10 in the figures. Referring to FIG. 1, a two-wire DC power source line having power conductors 1a, 1b is connected between a utility power provider (power source) and a utility customer (load). The meter 10 is disposed between the utility power provider and a utility customer in order to measure the power consumed by the utility customer. A GMR sensor 2 is placed in close proximity to the power conductor la to measure the magnetic flux generated in the power conductor 1a.

The GMR sensor 2 is magnetically coupled to the power conductor 1a. It is the object of the meter 10 to sense current flow in the power conductor 1a in order to determine power consumption of the utility customer. The GMR sensor 2 is sensitive to the magnetic flux caused by the current flow in the power conductor 1a. Responsive to the current flow in the conductor 1a, the GMR sensor 2 outputs a voltage that is related to the current flow through the power conductor 1a. The output voltage from the GMR sensor 2 is supplied to the analog multiplier 3.

A second input to the analog multiplier 3 is a voltage from the voltage divider 4. The potential across the power conductors 1a, 1b is detected using a load resistor or, as depicted in FIG. 1, the voltage divider 4. The analog multiplier 3 multiplies the analog voltage output of the GMR sensor 2 and the analog voltage output of the voltage divider 4 that is related to the potential across the power conductors 1a, 1b.

It is generally known that power consumed over time is the product of current and voltage over time. Accordingly, the analog multiplier 3 generates an output in voltage form that is a product of the voltage output of the GMR sensor 2 (which is related to the current in power conductor 1a) and the potential across the power conductors 1a, 1b. This product then is a voltage output, in analog form that is related to the instantaneous power consumption through the power conductors 1a, 1b.

The analog voltage output of the analog multiplier 3 is provided to an integrator 5. The integrator 5 integrates the input voltage signal that is representative of power consumption over time. The output of the integrator 5 is then a voltage that is related to power consumption with respect to time, such an output being in units of watt-hours. The voltage output of the integrator 5 is provided as an input to a voltage to frequency converter 6. The voltage to frequency converter 6 converts the voltage signal, representative of power consumption, to a frequency that is related to power consumption. Power consumption may then be displayed locally on the display 7. The display 7 may be either an analog or a digital device. Alternatively, the frequency related to power consumption may be provided to a transmitter 8 for transmission to a remote site where power consumption data of the utility customer serviced by the meter 10 is maintained.

Figure 2:
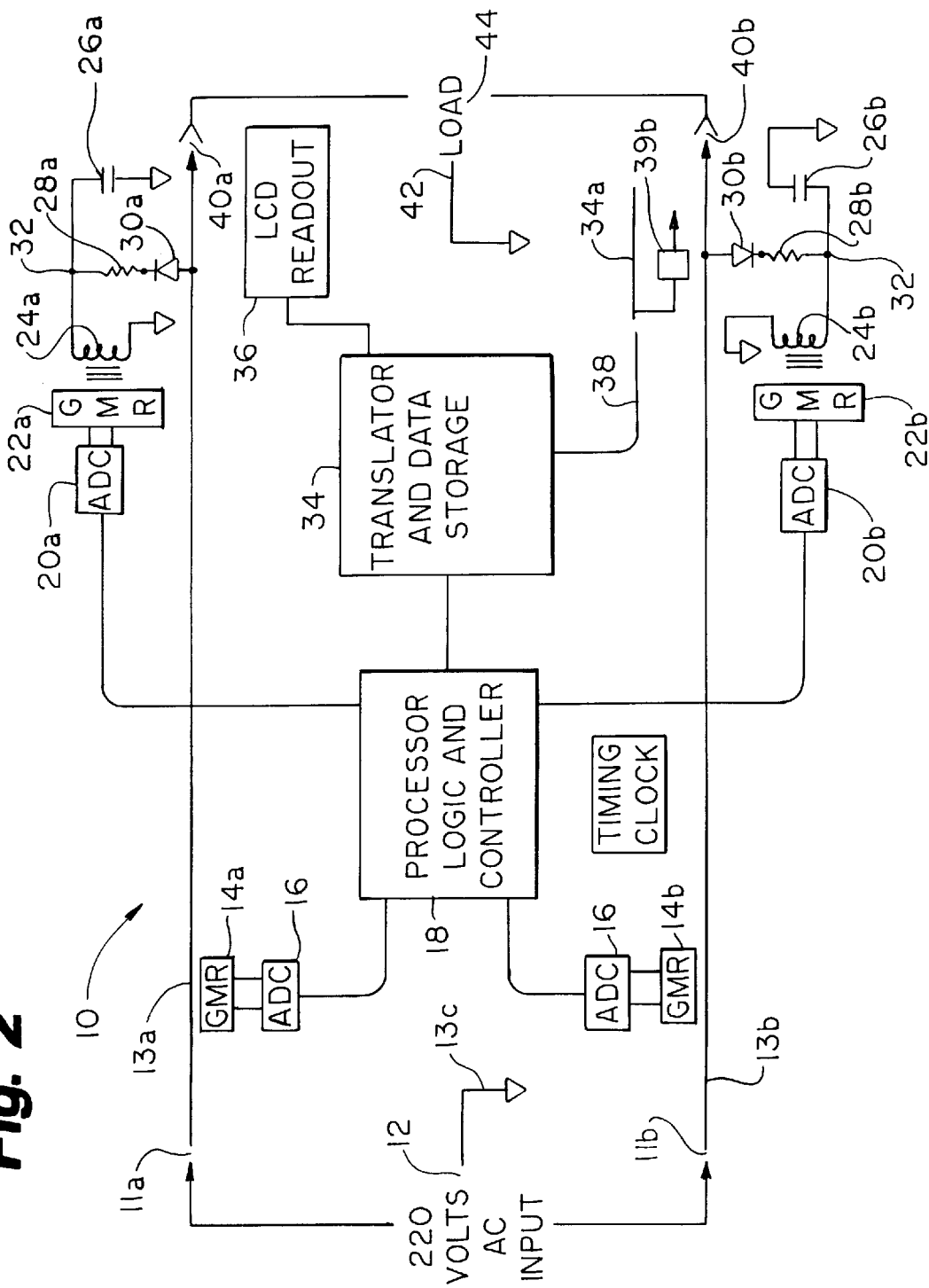
FIG. 2 is a schematic diagram of the electrical circuit of the present invention applicable to sensing AC and DC power consumption.

An alternative embodiment of the meter 10 of the present invention, applicable to both AC and DC power consumption, is depicted generally at 10 in FIG. 2. An AC or DC power source line is connected to the meter 10 at connectors 11a, 11b, and 12. The power source line is a three wire source having a first wire connected to the meter power conductor 13a at connector 11a, a second wire connected to the meter power conductor 13b at connector 11b, and the third neutral wire 13c connected at connector 12 to ground.

A first GMR sensor 14a is placed in close proximity to the power conductor 13a to measure the magnetic flux generated in the power conductor 13a. Similarly, GMR sensor 14b is placed proximate the power line 13b to measure the magnetic flux therein. The magnetic flux that is generated is proportionate to the current flowing through the lines 13a, 13b. A variation in the amount of current produces a related variation in the magnetic flux. The GMR sensors 14a, 14b are physically disposed spaced apart from the power conductors 13a, 13b, there being no physical connection between the GMR sensors 14a, 14b and the respective power conductors 13a, 13b. The output of the GMR sensors 14a, 14b is an analog voltage signal representative of current flowing in the power lines 13a, 13b, respectively.

A first analog to digital converter 16a is connected to GMR sensor 14a and a second analog to digital converter 16b is connected to GMR sensor 14b. The analog to digital converters 16a, 16b are connected to the processor 18. The analog to digital converters 16a, 16b receive the analog input from the respective GMR sensors 14a, 14b and convert the input signal to digital format. The output of the analog to digital converters 16a, 16b is a digital signal representative of current flowing in the power lines 13a, 13b, respectively. The output is provided to the processor 18. The processor 18 determines the product of the differential of the voltage output of the digital converters 16a, 16b (the current sensors) and the voltage output of the digital converters 20a, 20b (the voltage sensors). For an AC application, the processor 18 determines the peak output from the digital converters 16a, 16b (the current sensors) and determines the aforementioned product at the time of peak occurrence.

The voltage on the respective power lines 13a, 13b is sensed by a second set of GMR sensors, GMR sensors 22a, 22b. For sensing an AC power source as depicted in FIG. 2, the AC may be rectified to DC. Accordingly, a respective rectification circuit is provided associated with each of the GMR sensors 22a, 22b.

The rectification circuit includes a diode 30a connected to the power line 13a. A corresponding diode 30b is connected to the power line 13b. The output connector of each of the diodes 30a, 30b is connected to a resistor 28a, 28b, respectively. The resistors 28a, 28b are used as current control devices. Capacitors 26a, 26b have a first grounded connector and a second connector coupled to the resistors 28a, 28b, respectively, at junctions 32. The capacitors 26a, 26b in conjunction with the resistors 28a, 28b and the respective diodes 30a and 30b, respectively, comprise rectifiers and filters. These rectification and filter circuits convert AC into DC for the purpose of representing the AC voltage as a DC voltage level.

The DC voltage from the junctions 32 is introduced to electromagnets 24a, 24b. The DC voltage in the electromagnets 24a, 24b generates a magnetic flux. GMR sensors 22a, 22b react to the flux generated by the electromagnets 24a, 24b, respectively. Responsive to such flux, the GMR sensors 22a, 22b produce an output that is proportionate to the voltage on the power conductors 13a, 13b, respectively.

The GMR sensors 22a, 22b are coupled to analog to digital converters 20a, 20b. The analog to digital converters 20a, 20b condition the analog voltage signal to a digital format for use in processor 18.

The processor 18 utilizes the digital voltage signal available from GMR sensors 22a, 22b with the digital current signal available from GMR sensors 14a, 14b to calculate the energy consumption in kilowatts, energy consumption being power and power being equal to the product of the sensed current and voltage. The output of processor 18, representative of the energy consumption in kilowatts, is introduced to a translator and data storage device 34. The translator and data storage device 34 translates the output of the controller 18 into a format suitable for presentation on the LCD readout 36 and stores the kilowatt consumption for later transfer to a communications device via output 38.

The output 38 of the processor 18 may be coupled by a transmission line 39a, the transmission line 39a being a wire, telephone line, fiberoptic cable, network line or the like, to a central site that records the kilowatt consumption. Alternatively, output 38 can be coupled to a transceiver 39b that transmits a signal representative of the kilowatt consumption to a central site responsive to a received input command.

After sensing by the meter 10, the metered power on the power conductors 13a, 13b is then provided to the load 44 at output connectors 40a, 40b and neutral connector 42.

As can be seen, an aspect of the present invention is the sensing and digital processing circuits being coupled to the power conductors 13a, 13b only by means of the magnetic interaction available to the GMR sensors 14a, 14b and 22a, 22b. Accordingly, the sensors and digital processing circuits of the present invention are physically isolated from the power lines 13a, 13b, thereby providing lightning and transient protection thereto.

In an alternative preferred embodiment of the present invention, described with reference to FIGS. 3a–7, the sensitivity of the GMR sensors utilized to sense parameters related to power consumption is varied in order to accurately record power consumption through a wide range of power consumption extending from the highest levels to the lowest levels of power usage. The sensitivity of a GMR sensor is directly proportional to the drive current (S $I_D$), where S is sensitivity and $I_D$ is the drive current of the GMR sensor. Accordingly, the sensitivity is a function of the drive current. The output of the GMR sensor in voltage form is then directly proportional to the sensitivity and to the applied magnetic field. The applied magnetic field is a function of the potential across at the load carrying conductor or other selected sensed parameter.

Accordingly $$V_0 = S \cdot H$$

$$V_0 = S_{(i)} \cdot H_{(v)}$$

$$V_0 = K I_M \cos \omega t \cdot V_M \cos (\omega t - \theta)$$

where:

$V_0$ is the GMR sensor output in voltage form;

S is the sensitivity, the dependent variable of the sensitivity being the drive current, $I_D$, where, $I_D$ $I_M$ cos $\omega t$;

H is the applied field, which is directly proportional to the potential across the load carrying conductor; and K is an arbitrary constant.

The foregoing relationships are depicted graphically in FIGS. 3a and 3b, where the profile of the GMR sensitivity is depicted by the dashed sinusoidal form in FIG. 3a.

To further the derivation, if t=1/2f=½T, then the GMR sensor output is as indicated below:

$$V_0 = K I_M \cos (2\pi f \cdot 1/2f) \cdot V_M \cos (2\pi f \cdot 1/2f - \theta)$$

$$V_0 = K I_M V_M \cos (-\theta)$$

$$V_0 = K I_M V_M \cos (\theta)$$

The GMR sensor output, $V_0$, is equivalent to the peak instantaneous power. In order to have t=½T, the second harmonic component output, that is, $V_0$, must be sampled twice for each power cycle. In order to make this sampling, the peak detector detects the peak of the sinusoidal current component and samples the second harmonic component output, $V_0$, at the instant when the peak is detected by the peak detector. In other words, the sampling of the output, $V_0$, is conducted when i=|$I_M$| or when cos $\omega t = \pm 1$, as depicted in FIGS. 4a and 4b. Alternatively, the sampling can off-peak and 180 degrees apart. The accuracy of the measurement is inherently greater at the peak than off-peak and is therefore preferred.

Referring to FIG. 5, the foregoing requires the use of at least two GMR sensors along with supporting electronics in order to conduct the sensing defined above. The meter of the preferred embodiment of the present invention depicted in FIG. 5 is indicated generally at 50. A first GMR sensor 52 captures the sinusoidal function of the current in the power conductor 51 by sensing the field generated by the electromagnet 56. Electromagnet 56 may be a coil or even a straight length of wire. The sinusoidal function that is sensed by the first GMR sensor 52 includes both magnitude and phase.

The output of this first GMR sensor 52 is then processed in the voltage to current converter 57. The current output of the voltage to current converter 57 is a current that is representative of the sensed voltage. As indicated in FIG. 5, the output current is represented by $K_1 I_M$ cos $\omega t$. This output current is used to drive and sample a second GMR sensor 58.

The second GMR sensor 58 detects the magnetic field generated by the electromagnet 60. As indicated in FIG. 5, the output voltage is represented by $V_M$ cos $(\omega t - \theta)$. This voltage is related to the voltage potential across the power carrying conductors 51, 62. FIG. 4a illustrates the various functions, current, sensitivity, and potential, and FIG. 4b illustrates the output of the second GMR sensor 58.

The peak detector 64 senses when the slope of the current is zero. This occurs when cos $\omega t = |\pm 1|$. Current is maximum at that point, as indicated in FIGS. 4a, 4b. Accordingly, the output of the op amp 66 to the processor 68 is representative of a constant, $K_2$ times the peak power, $P_{peak}$. It is known that average power, $P_{avg} = \frac{1}{2} P_{peak}$(WATT). The output of the second GMR sensor 58 is quantized and is then divided by two to achieve average power consumed in the load 70. This process is conducted using the microprocessor 68. The output 72 of the processor 68 is a signal representative of the average power consumed in the load 70.

The output 72 of the processor 68 may be coupled by a transmission line, as indicated above with reference to FIG. 2, to a central site that records the kilowatt consumption. Alternatively, output 72 can be coupled to a transceiver 39b, as indicated above with reference to FIG. 2, that transmits a signal representative of the kilowatt consumption to a central site responsive to a received input command.

To improve the sensitivity of the watt meter 50 and to introduce a high level of accuracy at low power consumption levels, an auto scaling feature is added to the watt meter 50. The auto scaler, depicted generally at 79 in FIG. 8, controls the drive current for the first GMR sensor 52. During low power consumption operation, the auto scaler 79 increases the drive current, $I_D$, to GMR sensor 52 so that the sensitivity of GMR sensor 52 is increased. A third GMR sensor 80 is utilized to sense the current flow through the power load carrying conductors 51, 62 and the auto scaler 79 (described in detail below) determines the drive current, $I_D$ to GMR sensor 52 depending on the magnitude of the load current sensed by GMR sensor 80. Like numerals in FIGS. 5 and 8 denote like components.

Referring to FIG. 6, the graph illustrates the relationship between the drive current, $I_D$ of the first GMR sensor 52 and the magnitude of the load current I, as sensed by the third GMR sensor 80. The relationship illustrates a relatively low drive current when the load current is high and a relatively high drive current when the load current is low.

Referring to FIG. 7, the change in sensitivity of GMR sensor 52 is effected by varying the drive currents from $I_{D1}$ to $I_{D4}$. As illustrated, the GMR sensor 52 sensitivities, $S_1$ to $S_4$, correspond to the drive currents $I_{D1}$ to $I_{D4}$, respectively.

The auto scaler 79 maintains a communication link with the microprocessor 68 so that the microprocessor 68 is aware of the drive current level, $I_{D1}$ to $I_{D4}$, that is currently driving the first GMR sensor 52. Accordingly, the microprocessor 68 includes a scaling factor when calculating average power that accounts for the differing drive current level. The output of each of the GMR sensors 52, 58 is integrated over time by the processor 68 to achieve a signal output that is representative of watt hour consumption. Such consumption may be displayed on a digital display as previously described. Further, an RF transceiver, telephonic interface or direct line may be coupled to the microprocessor 68 to conduct remote reading and programming of the watt hour meter 50.

Referring again to FIG. 8, the auto scaler 79 is comprised of the constant current source 82, the third GMR sensor 80, the RMS device 84, the first analog-to-digital (A-D) converter 86, the processor 68, and the digital-to-analog (D-A) converter 88. The constant current source 82 supplies a stable and constant current to drive third GMR sensor 80. The third GMR sensor 80 detects the magnetic field that is generated in the electromagnet 56 by the current flowing in the load carrying conductor 51. The magnitude of the magnetic field is proportional to the current flow through the conductor 51. The output of the third GMR sensor 80 is a form of a sinusoidal function. The output is provided to the RMS device 84. The RMS device 84 converts the sinusoidal output of the third GMR sensor 80 into a root-mean-square value. This RMS value also represents the magnitude of current flow through the load carrying conductor 51. The output of the RMS device 84 is provided as an input to the first analog to digital converter 86.

The first analog-to-digital converter 86 converts the analog equivalent of the current flow in the load carrying conductor 51 into digital form and provides it as an input to the microprocessor 68. The processor 68 evaluates the digital signal provided by analog-to-digital converter 86 and sends out a signal to digital-to-analog converter 88. The signal input to digital-to-analog converter 88 is inversely proportional to the signal provided by analog-to-digital converter 86 to the processor 68 in keeping with the relationship between the drive current and the load current depicted in FIG. 6.

The digital-to-analog converter 88 converter supplies a drive current to the first GMR sensor 52. The drive current to GMR sensor 52 varies as a function of the current flow through the load carrying conductor 51 and accordingly alters the sensitivity of the first GMR sensor 52. When power consumption in the load 70 is low, the magnetic field generated by the load carrying conductor 51 is also low. At such time, digital-to-analog converter 88 provides a higher drive current to the first GMR sensor 52 so that the sensitivity of the GMR sensor 52 is high. When power consumption in the load 70 is high, the magnetic field generated by the load carrying conductor 51 is also high. At such time, digital-to-analog converter 88 provides a relatively lower drive current to the first GMR sensor 52 so that the sensitivity of the first GMR sensor 52 is low. Accordingly, the auto scaler 79 functions to make the first GMR sensor 52 more sensitive at lower power load levels than at high power load levels.

Figure 8:
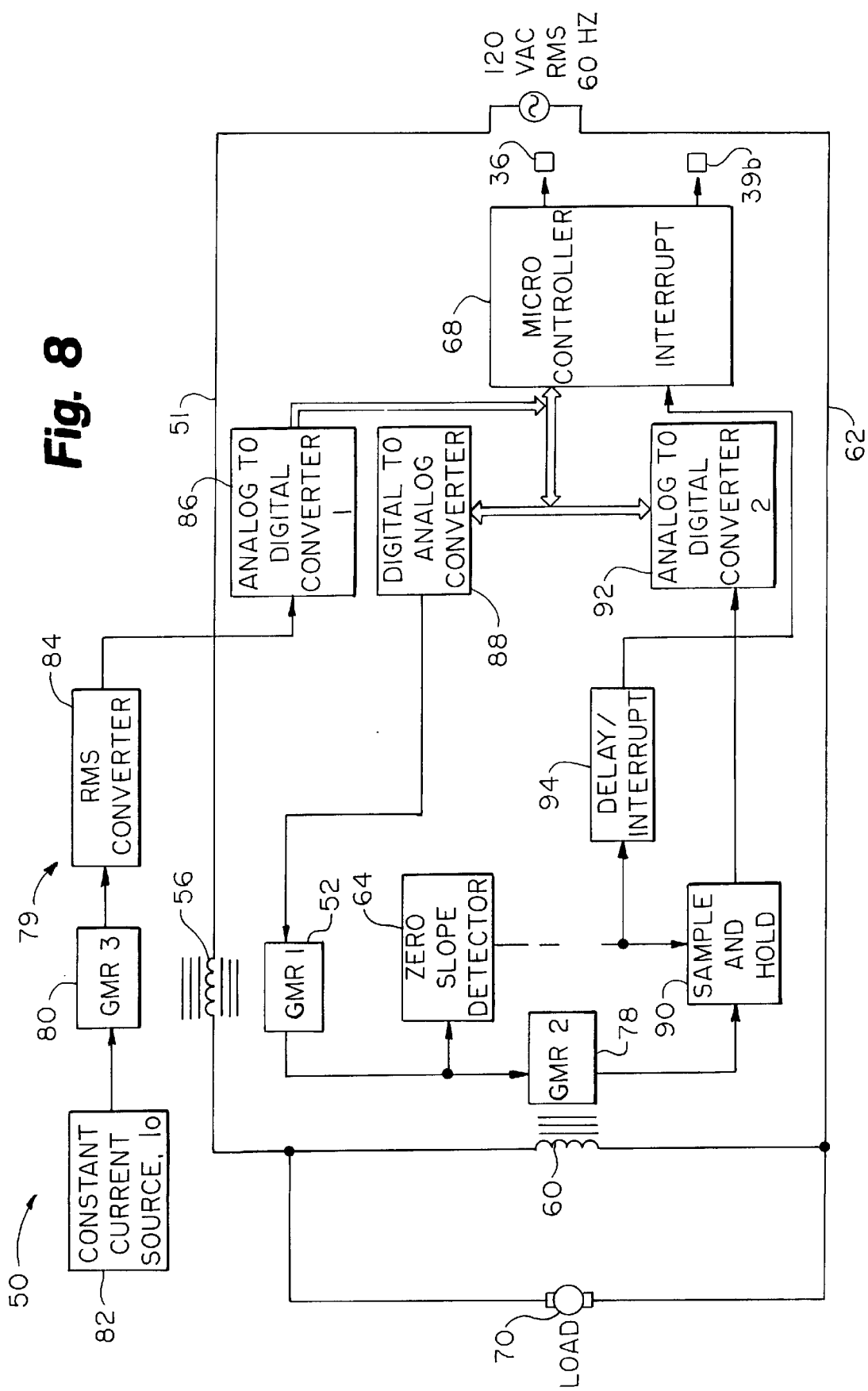
FIG. 8 is an additional preferred embodiment circuit diagram of the electrical circuit of the present invention.

The actual sensing portion of the watt meter depicted at 50 in FIG. 8 is comprised of the first GMR sensor 52, the second GMR sensor 58, peak detector (zero slope detector) 64, track and hold device 90, second analog to digital converter 92, processor 68, and a delay circuit 94. The first GMR sensor 52 is driven by the current supplied by digital-to-analog converter 88. The first GMR sensor 52 detects the magnetic field generated by the current flowing through the load carrying conductor 51. Accordingly, the output of the first GMR sensor 52 is proportional to such load current as modified by the scaling factor.

The GMR sensor 58 detects the magnetic field that is generated by the potential coil 60. The potential coil 60 is coupled across the two load carrying conductors 51, 62. As distinct from first GMR sensor 52, the second GMR sensor 58 detects the voltage of the load carrying conductors 51, 62. The current drive for the second GMR sensor 58 is proportional to the current output of first GMR sensor 52.

As depicted in FIG. 9, the zero slope detector 64 detects the point of zero slope of the sinusoidal function at the output of the first GMR sensor 52. The zero slope detector 64 also generates narrow pulses at the instant of detecting a zero slope. FIG. 9 depicts the function of the zero slope detector 64, the output of which is a train of spaced apart narrow pulses. The pulse width of the pulses is selected to be as narrow as reasonably practical, preferably less than about 8 ms and most preferably about 2 microseconds.

The track and hold device 90 tracks the output of the second GMR sensor 58 and holds the amplitude of the output at the instant when the output of first GMR sensor 52 reaches maximum, that is, when the slope of the output of first GMR sensor 52 equals zero. The function of the track and hold device 90 is depicted graphically in FIG. 10. The output of the track and hold device 90 is seen as a series of connected pulses, the amplitude of which is equal to the amplitude of the second GMR sensor 58 at the time that the zero slope detector 64 detected a zero slope condition of the first GMR sensor 52.

Analog to digital converter 92 converts the analog equivalent signal output from track and hold device 90 into digital form and conveys this information to the processor 68. The delay circuit 94 interrupts the processor 68 to read the output of the analog to digital device 92. The delay circuit 94 delays the interrupt for a period until the analog to digital device 92 output stabilizes.

The processor 68 evaluates average power consumption, that is watthours, using both the scaling factor and analog to digital device 92 output level. The microprocessor 68 also maintains the interface between the digital display 36 and the RF transceiver 39b.

Analog-to-digital converters 86, 92 are depicted as separate units for clarity of understanding. However, as depicted in FIG. 8a, it is acceptable to multiplex the function of multiple analog-to-digital converters with a multiplexer 87 and a single analog-to-digital converter 89.

FIGS. 11–13 depict an alternate current sensor 100 for use in the meter 10 of the present invention. FIG. 11 depicts a current sensor 100 for use with an AC application. Power conductors 102, 103 convey electrical power from a utility to an AC load 104. It is the power consumed in the load 104 that is to be measured and reported back to the utility for billing of the customer. In order to generate the datapower consumption data, the current in power conductor 102 must be measured. The current flowing in power conductor 102 creates a flux in power conductor 102 that defines an annular pattern about power conductor 102. The GMR sensor 105 senses the flux generated by the current flowing in the power conductor 102. The GMR sensor 105 outputs a voltage that is related to the amount of current flowing in the power conductor 102. The GMR sensor 105 has an output transfer curve. The transfer curve ranges from sensing low power consumptions to sensing relatively high power consumptions. The transfer curve is most linear between the extremes of low power consumption and high power consumption. Accordingly, the accuracy of the sensing of the power consumption is greatest in the linear portion of the output transfer curve of the GMR sensor 105.

For AC applications as depicted in FIG. 11, the current sensor 100 utilizes a variable solenoid coil 106 to enhance or decrease the imminent magnetic field in order to keep the resultant field within the linear portion of the GMR output transfer curve. When the load 104 is consuming relatively low power, the solenoid coil 106 adds to the weak field generated by the relatively low current flow in order to provide a resultant field that keeps the GMR sensor 105 within the linear portion of the GMR output transfer curve. Conversely, when the load 104 is at relatively high power consumption and a relatively high current is flowing in power conductor 102, the solenoid coil 106 is utilized to subtract from the magnetic field generated by the high current flow in order to provide a resultant field that is positioned within the linear portion of the GMR output transfer curve. A feedback signal from an inversion device 110 energizes the solenoid 106 to maintain the GMR sensor 105 within the linear portion of the GMR output transfer curve. The error signal is produced by an electrical connection to the power conductor 102. The electrical connection is fed into an amplifier that provides a 180° phase inversion. The output of the amplifier is provided to the solenoid 106 with a variable gain, thereby providing the adjustment of the dynamic range of the GMR sensor 105.

Referring to FIG. 12, a current sensor 100 is depicted for use with a direct current (DC) current. Like components are similarly numbered in FIGS. 11 and 12. In FIG. 12, a permanent magnet 107 is substituted for the solenoid 106 of FIG. 11. The permanent magnet is utilized similarly to the use of the solenoid 106 in order to produce either an additive or canceling field in order to keep the resultant field generated by the current flowing in power conductor 102 and the field generated by the permanent magnet 107 within the linear portion of the GMR output transfer curve of the GMR sensor 105. By switching the polarity of the permanent magnet 107 relative to the GMR sensor 105 or by varying the distance of the permanent magnet 107 relative to the GMR sensor 105, the dynamic range of the GMR sensor 105 is affected.

In operation, the power conductor 102 used for conducting DC (FIG. 12) or AC (FIG. 11) current to a load 104 generates a particular flux around the power conductor 102. At some point of power consumption, both high and low, the flux generated by the current flowing in the power conductor 102 will be outside the dynamic range of the GMR sensor 105. In this case, by electrically introducing an opposing flux, it is possible to measure both higher and lower currents than the GMR sensor 105 would normally facilitate. The error signal necessary to produce either the subtractive or additive flux is important since the error signal is used to provide feedback to the flux changing apparatus (either the solenoid 106 or the permanent magnet 107) for the generation of a vectorially added flux to the flux being generated by the current flowing in the power conductor 102. The error signal is level sensitive and detected by means of a multiple-level detector or a monotonic analog system and be further processed and provided to the flux modifying apparatus.

Turning to FIG. 13, the current sensor 100 as depicted in FIG. 11 for use with an AC load is depicted. The GMR sensor 105 has a center line defining an axis of sensitivity 108. Lines of flux that are parallel to the axis of sensitivity of 108 activate the GMR sensor 105. The solenoid coil 106 is depicted wound around the GMR sensor 105. The direction of current flow through the solenoid coil 106 determines whether the magnetic field generated by the solenoid coil 106 is additive or subtractive with respect to the magnetic flux produced by the current flowing in the power conductor 102.

Increased sensitivity of the GMR sensor 105 is achieved through the use of the Barkhausen effect. The Barkhausen effect consists of discontinuous changes in flux density which are known as Barkhausen jumps. These jumps are caused by the sudden irreversible motion of magnetic domain walls as they break away from pinning sites, as a result of a continuous change in magnetic field. Barkhausen noise depends on the interaction of the main walls with pinning sites. In the present application, the "toggling" of the magnet domains is used to produce an output due to the Permalloy 80 and its large Barkhausen characteristics. It should be noted that the Permalloy 80 is an inherent constituent of the layering of the GMR sensor 105.

The increased sensitivity of the GMR sensor 105 is the result of the ability to produce the sporadic broadband noise that is so intimate with the Barkhausen effect when a magnetic field is produced within the Permalloy 80 itself. This effect produces a gain to the added flux change which makes the GMR sensor 105 appear more sensitive to a given magnetic field. This renders the GMR sensor 105 more useful at measuring lower flux levels. For example, a gain of 5 was noted at a frequency of 333 hertz during laboratory tests done while investigating the GMR approach to measuring currents.

It will be apparent to those skilled in the art that various modifications can be made to the present invention without departing from the scope or spirit of the invention. Further, it is intended that the present invention cover modifications and variations of the present invention provided that such modifications and variations come within the scope of the appended claims and their equivalence.

What is claimed is:

1. A power consumption meter for measuring the power consumed by a load on a power conductor, the meter comprising:

first GMR sensor means, the first GMR sensor means being disposed proximate the power conductor and being magnetically coupled to the power conductor, the first GMR sensor means for detecting magnetic flux in the power conductor and producing a first output responsive to the detected magnetic flux that is representative of the current flowing through the power conductor;

second GMR sensor means, the second GMR sensor being disposed proximate the power conductor and being magnetically coupled to the power conductor, the second GMR sensor for detecting magnetic flux in the power conductor and producing a second output responsive to the detected magnetic flux that is representative of the voltage on the power conductor; and processor means being operably communicatively coupled to the first and second GMR sensor means and being responsive to the first output and the second output for producing a third output that is representative of the energy consumption of the load on the power conductor.

2. The power consumption meter of claim 1 wherein the first and second GMR sensor means are substantially electrically and physically isolated from the power conductor.

3. The power consumption meter of claim 1 wherein the first GMR sensor means has a characteristic sensor operating curve, the first GMR sensor means being selectively adjustable to operate in a substantially linear portion of the operating curve at conditions of low power consumption.

4. The power consumption meter of claim 1 wherein the first GMR sensor means comprises at least two first GMR sensors and wherein the second GMR sensor means comprises at least two second GMR sensors.

5. The power consumption meter of claim 1, wherein the second output is representative of the rectified voltage on the power conductor.

6. The power consumption meter of claim 1, further comprising a translator and data storage device, the translator and data storage device receiving the third output for translating the third output to a format suitable for presentation on a visual display.

7. The power consumption meter of claim 1, further comprising a translator and data storage device, wherein the translator and data storage device stores the third output for transfer to a central site.

8. The power consumption meter of claim 7, wherein the transfer is effected by communicatively coupling the translator and data storage device to transmission means, the transmission means being communicatively coupled to the central site.

9. The power consumption meter of claim 8, wherein the transmission means are selected from a group consisting of:
   a radio frequency transmitter;
   a radio frequency transceiver;
   a wire direct line interface;
   a fiberoptic cable interface; and
   a telephonic interface.

10. A power consumption meter for measuring the power consumed by a load on a power conductor, the meter comprising:
    first GMR sensor means, the first GMR sensor means having an input for receiving a selectively variable drive current and being magnetically coupled to the power conductor means for detecting magnetic flux in the power conductor, the first GMR sensor having a magnetic flux detection sensitivity adjustment being adjustable proportionate to the drive current, the first GMR sensor adapted to produce a first output responsive to the detected magnetic flux that is representative of the load current in the power conductor;
    a peak detector, the peak detector responsive to the first output in producing a second output representative of the peak load current in the power conductor;
    a second GMR sensor, the second GMR sensor responsive to the first output, the second GMR sensor magnetically coupled to the power conductor and adapted to detect magnetic flux in the power conductor, the second GMR sensor adapted to produce a third output responsive to the detected magnetic flux that is representative of the load voltage on the power conductor; and
    power evaluation means being operably communicatively coupled to the second GMR sensor and the peak detector, the power evaluation means for evaluating the average power consumption of the load on the power conductor in response to the second and third outputs.

11. The power consumption meter of claim 10, the meter having sensitivity adjustment means coupled to at least the first GMR sensor means for providing accurate power consumption readings particularly during conditions of low power consumption.

12. The power consumption meter of claim 10 wherein the first and second GMR sensor means are substantially electrically and physically isolated from the power conductor.

13. The power consumption meter of claim 10 wherein the first GMR sensor means has a characteristic sensor operating curve, the first GMR sensor means being selectively adjustable to operate in a substantially linear portion of the operating curve at conditions of low power consumption.

14. The power consumption meter of claim 13, further comprising an auto scaler circuit operably coupled to the first GMR sensor means to selectively control the magnitude of the drive current.

15. The power consumption meter of claim 14, wherein the auto scaler circuit comprises third GMR sensor means, the third GMR sensor means being magnetically coupled to the power conductor for detecting magnetic flux in the power conductor, the third GMR sensor means producing a fourth output responsive to the detected magnetic flux that is representative of the load current in the power conductor.

16. The power consumption meter of claim 15, wherein the auto scaler circuit further comprises a processor being operably communicatively coupled to the first GMR sensor means and to the third GMR sensor means, the processor controlling the magnitude of the drive current in response to the magnitude of the fourth output.

17. The power consumption meter of claim 16, wherein the magnitude of the drive current is controlled by the auto scaler circuit to be inversely proportional to the magnitude of the load current.

18. The power consumption meter of claim 10, wherein the power evaluation means comprises a processor for calculating the average power consumed by the load on the power conductor.

19. The power consumption meter of claim 10, wherein the power evaluation means comprises a multiplier and a processor, the multiplier and processor means being operably communicatively coupled to the peak power detector and second GMR sensor means, the multiplier being responsive to the second and third outputs in producing an output representative of the power consumed by the load on the power conductor.

20. The power consumption meter of claim 19, wherein the processor is adapted to calculate the average power consumed using the output representative of the peak power.

21. The power consumption meter of claim 20, wherein the power evaluation means comprises a track and hold circuit being operably communicatively coupled to the peak power detector and second GMR sensor means, the track and hold circuit being responsive to the second and third outputs for producing a continuous output representative of the peak power in the power conductor, the processor responsive to the second output and the pulses in evaluating average power consumed by the load on the power conductor.

22. The power consumption meter of claim 10, wherein the power evaluation means comprises a track and hold circuit and a processor being operably communicatively coupled to the peak power detector and second GMR sensor means, the track and hold circuit responsive to the second and third outputs in producing a continuous output representative of the peak power in the power conductor, the processor responsive to the second output and the pulses in evaluating average power consumed by the load on the power conductor, the processor controlling the magnitude of the drive current in response to the magnitude of the fourth output.

23. The power consumption meter of claim 22, wherein the processor uses a scaling factor in evaluating average power consumed by the load on the power conductor.

24. The power consumption meter of claim 10, wherein the power evaluation means is coupled to a display for displaying the average power consumed.

25. The power consumption meter of claim 10, wherein the power evaluation means is coupled to transmission means for transferring the evaluated average power consumption to a remote site.

26. The power consumption meter of claim 25 further including a translator and data storage device, wherein the transfer is effected by communicatively coupling the power evaluation means and the translator and data storage device to transmission means, the transmission means being communicatively coupled to the central site.

27. The power consumption meter of claim 26, wherein the transmission means are selected from a group consisting of;
a radio frequency transmitter;
a radio frequency transceiver;
a wire direct line interface;
a fiberoptic cable interface; and
a telephonic interface.

28. The power consumption meter of claim 10, wherein the power evaluation means are coupled to a transmission line for transferring the evaluated average power consumption to a remote central site.

29. A power consumption meter for measuring the power consumed by a load on a power conductor, comprising:
a first GMR sensor being magnetically coupled to the power conductor for detecting magnetic flux in the power conductor the detected magnetic flux being related to a load current in the power conductor; and
a second GMR sensor being magnetically coupled to the power conductor for detecting magnetic flux in the power conductor the detected magnetic flux being related to a load voltage on the power conductor.

30. The power consumption meter of claim 29 further including an auto scaler circuit for selectively scaling a sensitivity of the first GMR sensor.

31. The power consumption meter of claim 30 wherein the auto scaler circuit includes a third GMR sensor, the third GMR sensor being magnetically coupled to the power conductor for detecting magnetic flux in the power conductor, the third GMR sensor adapted to produce an output responsive to the detected magnetic flux that is representative of the load current in the power conductor.

32. The power consumption meter of claim 31, wherein the auto scaler circuit further comprises a processor, the processor controlling the magnitude of a first GMR sensor drive current in response to the magnitude of the third GMR sensor.

33. The power consumption meter of claim 32, wherein the magnitude of the drive current is controlled by the auto scaler circuit to be inversely proportional to the magnitude of the load current.

34. The power consumption meter of claim 29 further including power evaluation means, the power evaluation means having a processor for calculating an average power consumed by the load on the power conductor.

35. The power consumption meter of claim 34, wherein the power evaluation means comprises a multiplier and a processor, the multiplier producing an output representative of a peak power consumed by the load on the power conductor, the processor adapted to calculate the average power consumed using the output representative of the peak power.

36. The power consumption meter of claim 35, wherein the power evaluation means comprises a track and hold circuit and a processor, the track and hold circuit producing a series of connected pulses, the pulses representative of the peak voltage in the power conductor.

37. The power consumption meter of claim 29 further including power evaluation means, the power evaluation means having a track and hold circuit and a processor, the track and hold circuit producing a continuous output representative of a peak power in the power conductor, the processor evaluating average power consumed by the load on the power conductor, the processor adapted to control the magnitude of a first GMR sensor drive current.

38. The power consumption meter of claim 37, wherein the processor uses a scaling factor in evaluating average power consumed by the load on the power conductor.

39. The power consumption meter of claim 29, wherein the power evaluation means is coupled to a display for displaying the average power consumed.

40. The power consumption meter of claim 29 further including power evaluation means being communicatively coupled to the first and second GMR sensor means for evaluating average power consumed by the load on the power conductor, the power evaluation means being coupled to transmission means for transferring the evaluated average power consumption to a remote site.

41. The power consumption meter of claim 40, wherein the transmission means are selected from a group consisting of;
a radio frequency transmitter;
a radio frequency transceiver;
a wire direct line interface;
a fiberoptic cable interface; and
a telephonic interface.

42. The power consumption meter of claim 29, the meter having sensitivity adjustment means for providing accurate power consumption readings particularly during conditions of low power consumption.

43. The power consumption meter of claim 29 wherein the first and second GMR sensor means are substantially electrically and physically isolated form the power conductor.

44. The power consumption meter of claim 29 wherein the first GMR sensor means has a characteristic sensor operating curve, the GMR sensor means being selectively adjustable to operate in a substantially linear portion of the operating curve at conditions of low power consumption.

45. A current sensor for use in a watt-hour meter, comprising:
a GMR sensor for sensing a flux generated in a conductor by current flowing in the conductor, the GMR sensor sensitivity being increased by sensing a Barkhausen effect, the Barkhausen effect being produced by a magnetic field affecting the GMR sensor; and
a feedback circuit operably coupled to the GMR sensor for providing a flux that is additive to the flux generated in the conductor under a condition of relatively low current flow in the conductor and for providing a flux that is subtractive to the flux generated in the conductor under a condition of relatively high current flow in the conductor.

46. The current sensor of claim 45 providing current sensing for both alternating current and direct current application.

47. The current sensor of claim 45 wherein the feedback circuit includes a solenoid coil, the solenoid coil being wound around the GMR sensor.

* * * * *

UNITED STATES PATENT AND TRADEMARK OFFICE
CERTIFICATE OF CORRECTION

PATENT NO. : 6,026,355
DATED : February 15, 2000
INVENTOR(S) : Rahman et al.

It is certified that error appears in the above-indentified patent and that said Letters Patent is hereby corrected as shown below:

Column 5, line 27, after "(S" insert --∝--.

Column 5, line 33, delete "at".

Column 5, line 46, after "I$_D$" insert --∝--.

Column 6, line 3, after "can" insert --be--.

Column 8, line 45, delete "watthours" and insert --watt-hours--.

Column 8, line 60, delete "datapower" and insert --power--.

Column 14, line 39, delete "form" and insert --from--.

Signed and Sealed this

Twenty-seventh Day of March, 2001

Attest:

NICHOLAS P. GODICI

Attesting Officer

Acting Director of the United States Patent and Trademark Office